United States Patent [19]

Sugita

[11] Patent Number: 5,148,241
[45] Date of Patent: Sep. 15, 1992

[54] METHOD OF MANUFACTURING A SCHOTTKY DIODE DEVICE

[75] Inventor: Naomasa Sugita, Yokohama, Japan

[73] Assignee: Kabushiki Kaisha Toshiba, Kawasaki, Japan

[21] Appl. No.: 626,460

[22] Filed: Dec. 12, 1990

[30] Foreign Application Priority Data

Dec. 15, 1989 [JP] Japan .................................. 1-325394

[51] Int. Cl.$^5$ .......................................... H01L 29/48
[52] U.S. Cl. ........................................ 357/15; 357/13; 357/20
[58] Field of Search ................... 357/13, 15, 52, 20

[56] References Cited

U.S. PATENT DOCUMENTS

| | | | |
|---|---|---|---|
| 4,316,202 | 2/1982 | Mori | 357/15 |
| 4,641,174 | 2/1987 | Baliga | 357/22 E |
| 5,017,976 | 5/1991 | Sugita | 357/15 |

FOREIGN PATENT DOCUMENTS

| | | | |
|---|---|---|---|
| 2855816 | 6/1979 | Fed. Rep. of Germany . | |
| 55-162273 | 12/1980 | Japan . | |
| 56-50581 | 5/1981 | Japan | 357/15 |
| 59-35183 | 8/1984 | Japan . | |
| 61-147570 | 7/1986 | Japan | 357/15 |
| 1-257370 | 10/1989 | Japan | 357/15 |

OTHER PUBLICATIONS

Sixteenth Annual IEEE Power Electronics Specialists Conference Jun. 24–28, 1985, pp. 242–246, Toulouse, FR; B. J. Baliga et al.: "High Current JBS Rectifiers and their Impact on Switching Power Supplies".

*Primary Examiner*—William D. Larkins
*Attorney, Agent, or Firm*—Finnegan, Henderson, Farabow, Garrett and Dunner

[57] ABSTRACT

A Schottky diode device can be fabricated by forming a positive resist layer on an insulating layer formed on N type substrate, and patterning the resist layer. The pattern in the resist includes (i) a first isolation region-defining annular open pattern defining therewithin a device-forming region having a predetermined size, (ii) a second isolation region-defining open pattern dividing the device-forming region into a plurality of unit regions each having a maximum size defined to be 500 μm or less, and (iii) a plurality of individual openings having a size of 1 μm or less and arranged at a predetermined pitch in each of the unit regions. The patterned resist is used to pattern the insulating layer, and P type impurity regions including individual regions are formed using the patterned insulating layer as a mask. After removing the insulating layer, a barrier metal is formed forms Schottky barrier diodes with the individual P type impurity regions and connect them in parallel.

13 Claims, 5 Drawing Sheets

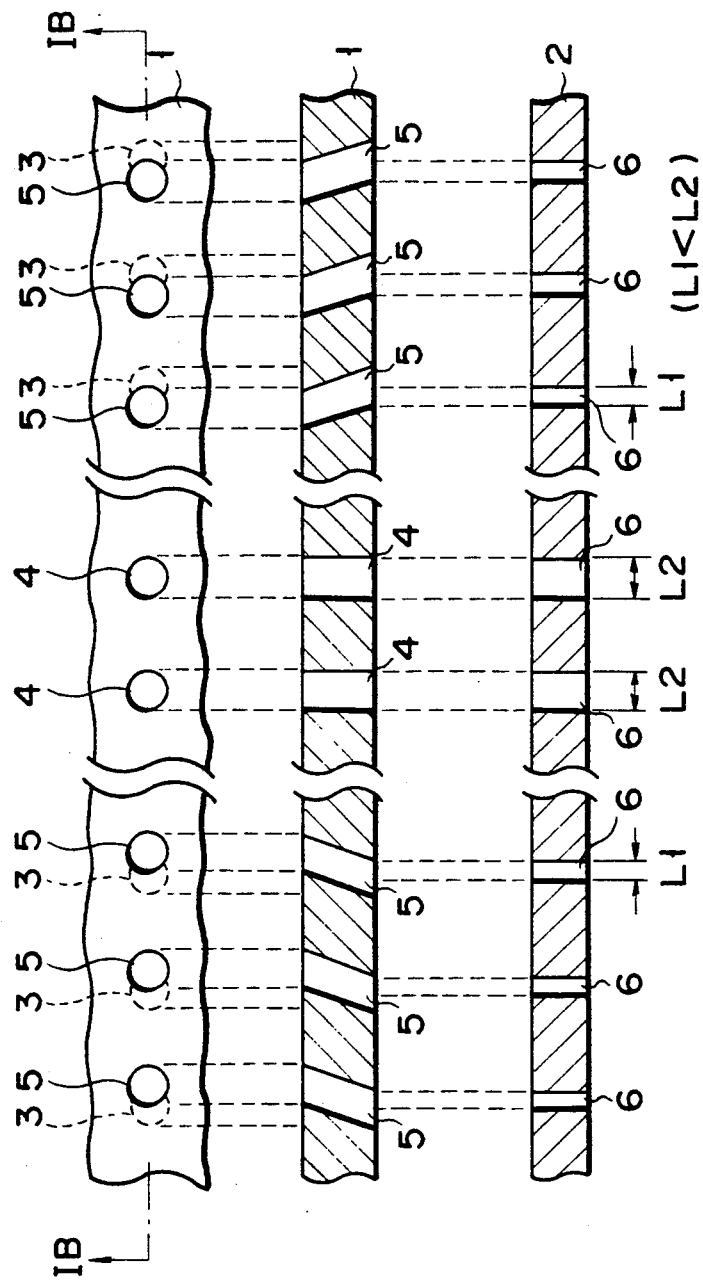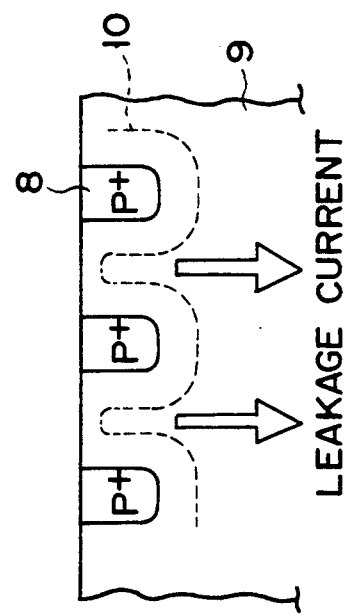
FIG. 1A PRIOR ART
FIG. 1B PRIOR ART
FIG. 1C PRIOR ART
FIG. 2 PRIOR ART

METHOD OF MANUFACTURING A SCHOTTKY DIODE DEVICE

BACKGROUND OF THE INVENTION

1. Field of the Invention

The present invention relates to a method of manufacturing a Schottky diode device.

2. Description of the Related Art

Schottky barrier diodes are semiconductor diodes formed by contact between a semiconductor layer and a metal layer, and have a nonlinear rectifying property. Of Schottky barrier diodes, a device is known from Published Examined Japanese Patent Application No. 59-35183, which includes a plurality of semiconductor regions formed in a semiconductor substrate, and a single metal layer contacting the semiconductor regions. Each semiconductor region forms a Schottky diode with the metal layer. Thus, the metal layer electrically connects the Schottky diodes in parallel.

More specifically, the diode device disclosed in the Japanese Publication has an N type epitaxial layer formed on a N+ silicon substrate. The surface area of the epitaxial layer is divided into a plurality of device formation regions by annular insulating layers. In each of the device formation regions, a number of P+ regions are selectively formed. A single metal layer is formed covering the surface of each device formation region, and an electrode metal is formed on the metal layer. A back electrode is formed on the back surface of the substrate.

The above-mentioned diode device is fabricated by forming an insulating layer on an entire surface of the epitaxial layer, followed by patterning a positive resist coated on the insulating layer through a photomask. The pattern of the photomask is projected on the positive resist with its size reduced, for example, to 1/5, using a stepper. The resultant resist pattern includes an annular, square isolation region-defining open pattern having a open width of about, e.g., 50 μm. The annular open pattern defines therewithin a device-forming region having a size of about 3,180 μm×3,180 μm in the surface region, of the N-type epitaxial layer, having a size of 3,500 μm×3,500 μm. Within the region enclosed by the annular open pattern, a large number of individual fine openings for defining semiconductor regions having a diammeter of, e.g., 1 μm are formed into a square matrix or staggered matrix at a pitch of e.g., 3 to 10 μm. Another annular open pattern is provided outside the resist to define the annular insulating layer having a width of, e.g., 150 μm with the first annular open pattern.

When the patterned resist thus formed is baked (post baking), the patterned resist is thermally shrunk from its peripheral portion toward its central portion due to the heat of the baking. As a result, the shape of the pattern formed in the resist is changed. For example, when the patterned resist having a size of 3,180 μm×3,180 μm is shrunk by a %, a positioning error of 3,180 (μm)×(a/100)×31.8×a (μm) occurs in an opening pattern of the peripheral portion of the resist. In fact, it was found that the positioning error of 0.3 μm occurred at an opening having a diameter of 1 μm of the peripheral portion of the resist.

More specifically, as shown in FIG. 1A, in the plane of the patterned resist after baking, the openings 5 of the peripheral portion is deviated toward the central portion with respect to the openings 3 before baking, though the position of each opening pattern 4 at the central portion of the resist is not shifted. As shown in FIG. 1B, the sectional shape of the openings 5 at the peripheral portion of the resist 1 is largely inclined toward the central portion, since the surface portion of the resist is mainly shrunk.

Referring to FIG. 1C, when anisotropy etching such as reactive ion etching (RIE) is performed to pattern the insulating layer 2 (e.g., silicon dioxide) formed on the substrate, using such a deformed patterned resist as a mask, the size L1 of the resulting openings 6 in the oxide 2 at the peripheral portion is smaller than the size L2 of the openings 6 at the central portion, since an effective area of the openings in the resist 1 at the peripheral portion is smaller.

When the patterned insulating layer 2 in which the size L2 of the openings 6 at the central portion is largely different from the size L1 of the openings 6 of the peripheral portion is used as a mask, and ion implantation is performed to form p+-type regions in the semiconductor substrate, the resulting p+-type regions become narrower at the peripheral portion of the device region, and, in the worst case, the p+-type region is not formed. Thus, a Schottky barrier can not be formed with high dimensional accuracy. Therefore, as shown in FIG. 2, when a reverse bias is applied to a p-n junction between each p+-type region 8 and an n-type epitaxial layer 9, depletion layers 10 formed around the p+-type regions 8 at the peripheral portion of the device region are not combined, or a reverse bias of as large as, e.g., 0.5 V or more must be applied to combine the depletion layers 10. As a result, a leakage current is increased, resulting in failure to obtain a diode device having excellent electric properties.

SUMMARY OF THE INVENTION

It is an object of the present invention to provide a method of manufacturing a Schottky diode device, which can form a Schottky barrier portion with high dimensional accuracy, producing a device having excellent electric properties by using a photoresist, without the resist being deformed due to thermal shrinkage of the resist at post-baking.

According to the present invention, there is provided a method of manufacturing a Schottky diode device comprising the steps of:

forming an insulating layer on a surface of a semiconductor substrate of a first conductivity type;

forming a positive resist layer on the insulating layer;

forming, in the positive resist layer, a pattern comprising:

(i) a first isolation region-defining open pattern defining therewithin a device-forming region having a predetermined size in the semiconductor substrate, (ii) a second isolation region-defining open pattern dividing the device-forming region into a plurality of unit regions each having a maximum size defined to be 500 μm or less, and (iii) a plurality of individual openings having a size of 1 μm or less and arranged at a predetermined pitch in each of said unit regions;

etching the insulating layer by using the patterned resist layer as a mask to selectively expose a surface of the semiconductor substrate;

removing the patterned resist;

forming semiconductor regions of a second conductivity type opposite to the first conductivity type in the exposed surface of the semiconductor substrate;

removing the remaining insulating layer within the device region to exposed the surface of the device-forming region; and forming a barrier metal layer on the exposed device-forming region to contact the semiconductor regions so as to electrically connect them in parallel.

The present invention also provides a Schottky barrier diode device comprising:

a semiconductor substrate of a first conductivity type;

an annular insulating layer formed on the substrate and defining a device region therewithin;

a first, annular, isolation region of a second conductivity type opposite to the first conductivity type, formed in the device region along the annular insulating layer;

a second isolation region of the second conductivity type, dividing the device region into plurality of unit regions each having a maximum width defined to be not more than 500 $\mu$m;

a plurality of semiconductor regions of the second conductivity type, formed in each of the device region, said semiconductor regions having a planar size of 1 $\mu$m or less and being arranged at a predetermined pitch; and a barrier metal layer contacting the semiconductor regions to electrically connect them in parallel.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1A is a plan view showing a patterned resist mask pattern after baking obtained by using the conventional technique;

FIG. 1B is a sectional view taken along the line IB—IB of FIG. 1A;

FIG. 1C is a sectional view showing the patterned oxide layer obtained by using the resist shown in FIG. 1A;

FIG. 2 is a sectional view showing a periphrel porion of the Schottky diode manufactured by the conventional technique;

DETAILED DESCRIPTION OF THE PREFERRED EMBODIMENTS

A method of manufacturing a Schottky barrier diode device according to an embodiment of the present invention will be described below with reference to the accompanying drawings.

Figure 3A:
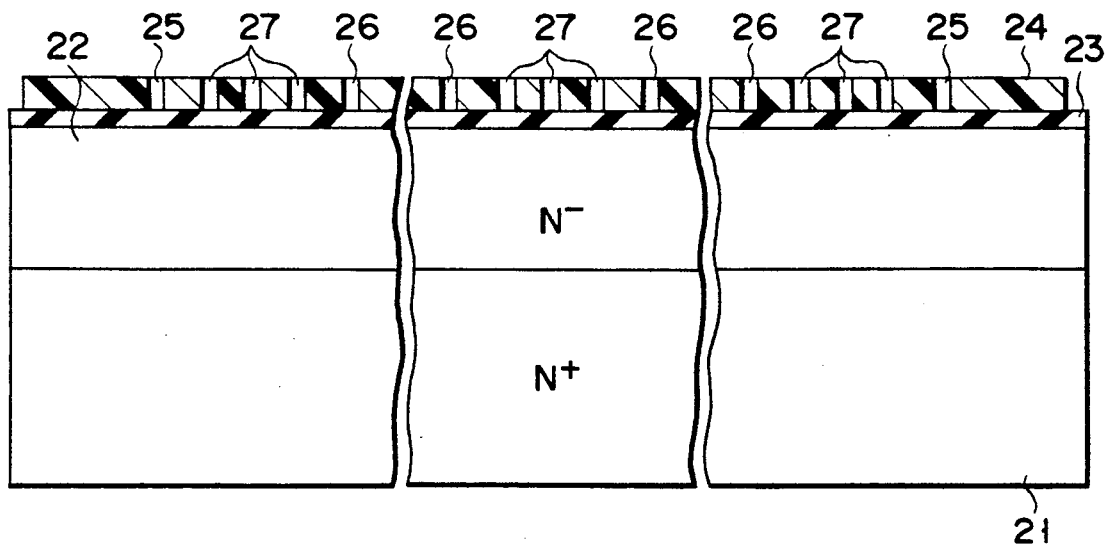
FIG. 3A to 3B are sectional views sequentially illustrating the method of the invention.

As shown in FIG. 3A, an $n^-$-type (0.7 to 0.9 $\Omega$.cm) epitaxial layer 22 having a thickness of 5 to 6 $\mu$m is formed on an $n^+$-type (0.001 to 0.003 $\Omega$.cm) silicon substrate 21 having a thickness of 250 $\mu$m. An $SiO_2$ film 23 having a thickness of 5,000 to 10,000 Å is formed on the surface of the epitaxial layer 22.

Then, a positive resist layer 24 is coated on the oxide layer 23, and is processed into a predetermined pattern using a photomask. The positive resist includes a novolak resin such as NPR-820 available from Nagase Sangyo, Japan.

Figure 4:
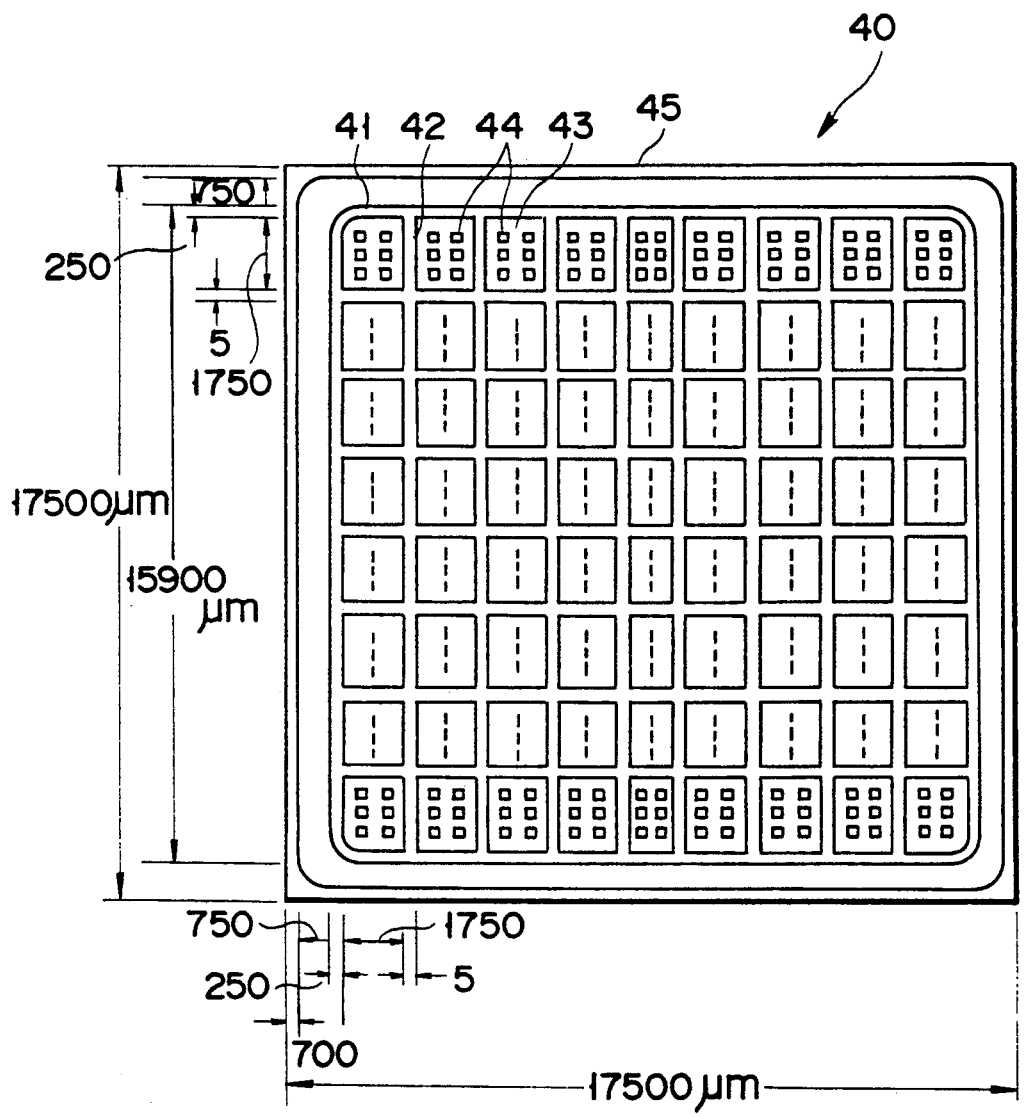
FIG. 4 is a plan view showing a photomask used in the method of the invention.

The photomask used in patterning the resist layer 24 is shown in FIG. 4. The photomask 40 shown in FIG. 4 is to project its pattern on the resist layer 24 with its size reduced to 1/5, using a stepper. Thus, the photomask 40 has a first annular isolation region-defining open pattern 41 (having an open width of, e.g., 5$\times$50 $\mu$m), which defines therewithin a device-forming region having a size of, e.g., about 5$\times$3,180 $\mu$m$\times$5$\times$3,180 $\mu$m in a region having a size of, e.g., about 5$\times$3,500 $\mu$m $\times$5$\times$3,500 $\mu$m, and a second annular isolation region-defining open pattern 42 having an open width of, e.g., 5$\times$1 $\mu$m, which divides the device-forming region into a plurality of, e.g., 72, rectangular unit regions each having a size of, e.g., about 5$\times$350 $\mu$m$\times$5$\times$350 $\mu$m in a matrix. In each of the unit regions, a large number of individual fine square openings each having a size of, e.g., 5$\times$1 $\mu$m$\times$5$\times$1 $\mu$m are formed and arranged in a square matrix at a pitch of, e.g., 5$\times$5 $\mu$m. Further, an annular open pattern 45 is provided at the periphery of the mask, which defines an annular oxide layer having a width of, e.g., 5$\times$150 $\mu$m between it and the open pattern 41. In practice, a plurality of such photomasks are used to form a plurality of Schottky diode devices on a wafer, but the fabrication of one Schottky diode device is explained herein for brevity.

Returning to FIG. 3A, the resist layer 24 on the oxide layer 23 is exposed through the photomask 40 mentioned above, and developed to form open patterns therein corresponding to the open patterns of the photomask 40, selectively exposing the underlying oxide layer 23. In this case, openings 27 made in the resist 24 corresponding to the rectangular openings 44 in the photomask 40 have a substantially circular shape having a diameter of 1 $\mu$m by diffraction of an exposure light at the corner of each opening 27 of the photomask 40.

Thus, a large annular open pattern 25 corresponding to the annular open pattern 41 of the photomask 40, an annular open pattern 26 corresponding to the matrix open pattern 42 of the photomask 40, and fine individual openings 27 corresponding to the fine openings 44 of the photomask 40 are formed in the resist layer 24. A peripheral annular open pattern corresponding to the open pattern 45 of the photomask is also provided.

After the patterned resist layer 24 thus formed is baked, the oxide layer 23 is etched using the patterned resist layer 24 as a mask to form open patterns corresponding to the open patterns of the resist layer 24 in the oxide layer 23. Thereafter, the resist layer 24 is removed.

Figure 3B:
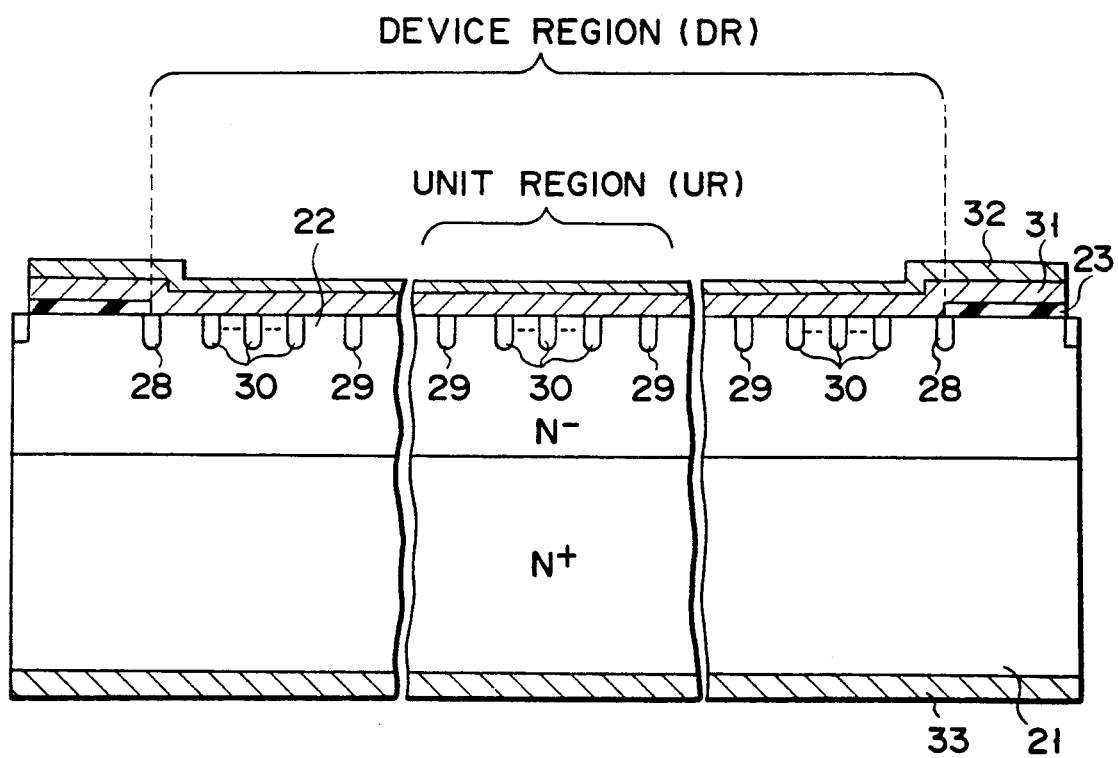

Then, a thin SiO$_2$ film (not shown) is formed on the surface portion of the epitaxial layer 22 exposed by the selective removal of the oxide layer 23, and a P type impurity such as boron (B) is ion-implanted into the epitaxial layer 22 using the patterned oxide layer 23 as a mask at an acceleration voltage of 50 keV and a dose of $1.0 \times 10^{15}$ cm$^{-2}$. The implanted ions are activated and diffused to form p$^+$-type regions having a junction depth of 1 to 2 μm. Thus, as shown in FIG. 3B, a large annular P$^+$ region 28 (a first element isolation region), a matrix P$^+$ region 29 which divides the device region DR enclosed by the region 29 into a plurality of rectangular unit regions UR, and individual P$^+$ regions formed in each unit region UR are formed in the epitaxial layer 22.

Then, a gettering is performed, and the oxide layer 23 is removed except for its peripheral annular layer. Thereafter, a barrier metal layer 31 is formed entirely on the exposed epitaxial layer 22, including the P$^+$ regions 28, 29 and 30, and also on the remaining annular oxide layer 23. As the barrier metal, titanium (Ti), molybdenum (Mo), hafnium (Hf), vanadium (V), cobalt (Co), niobium (Nb), chromium (Cr), nickel (Ni), tungsten (W), platinum (Pt), palladium (Pd), or a silicide thereof acting as a barrier can be used. It may be formed by sputtering and to a thickness of, e.g., 2,000 Å. Each P$^+$ region 30 forms a Schottky barrier with the barrier metal layer 31. Next, on the barrier metal layer 31, an electrode metal layer 32, such as aluminum (Al), is formed by sputtering to a thickness of 4 to 8 μm. Although the barrier metal layer 31 and the metal electrode 31 are both formed, only the barrier metal layer may be formed. Further, the barrier metal layer may be formed to be divided into a plurality of portions, and the metal electrode may be formed to cover the barrier metal layer potions so as to connect the Schottky diodes in parallel.

Finally, a back electrode 33 such as vanadium (V) having a thickness of 400 Å, nickel (Ni) having a thickness of 8,000 Å or gold having a thickness of 2,000 Å is formed on the lower surface of the silicon substrate 21, obtaining the desired Schottky barrier diode device in which Schottky barrier diodes are electrically connected by the metal layer in parallel.

According to the method of the invention as described above, the photomask 40 used in patterning the photoresist is divided into smaller unit regions each having a size of about 5×350 μm×5×350 μm. Therefore, the resist processed using the photomask 40 has its area correspondingly divided into smaller unit regions each having a size of about 350 μm×350 μm. For this reason, as shown in FIG. 5A, even when the patterned resist 24 is thermally shrunk from its peripheral portion (portion B) to its central portion (portion A) during the post-baking, the original individual openings 27 in the resist 24 at the peripheral portion B is only very slightly changed in shape.

That is, when shrinkage of the unit region of the resist 24 is a %, then each side of the unit region of the resist is shrunk by a (%)×350 (μm)/100=a (%)×3.5 (μm). When the shrinkage a is assumed to be 0.01, the maximum shrinkage of each side of the unit region of the resist is 0.035 μm. Therefore, it is confirmed that the openings 27', after the baking, of the unit region at the peripheral portion B is shifted by only about 0.035 μm with respect to the openings 27 before baking. As a result, the positioning errors of the openings 27' of the unit region of the resist 24 are about 3.5% or less with respect to the diameter of the openings 27. These positioning errors are acceptable in a normal process and do not pose serious problems.

Figure 5:
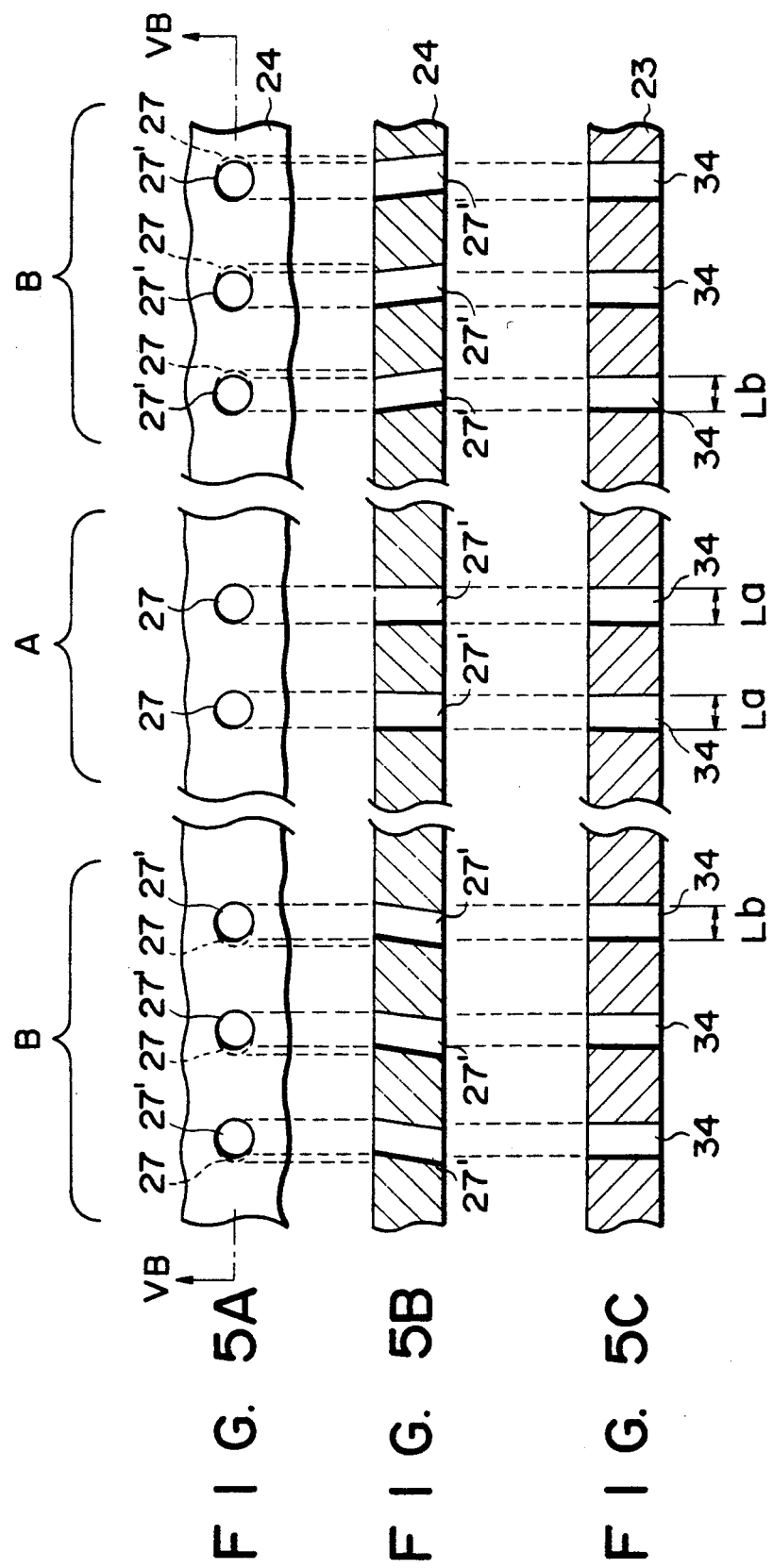
FIG. 5A is a plan view showing a patterned resist mask pattern after baking obtained according to the method of the invention.
FIG. 5B is a sectional view taken along the line VB—VB of FIG. 5A.
FIG. 5C is a sectional view showing the patterned oxide layer obtained by using the patterned resist shown in FIG. 5A.

As shown in FIG. 5C, when anisotropy etching, e.g., RIE process, is performed to the oxide layer 23 using the patterned resist 24 after baking as a mask, openings 34 made in the underlying oxide layer 23 can have a size La at the central portion and a size Lb at the peripheral portion, with La and Lb being almost equal.

Figure 6:
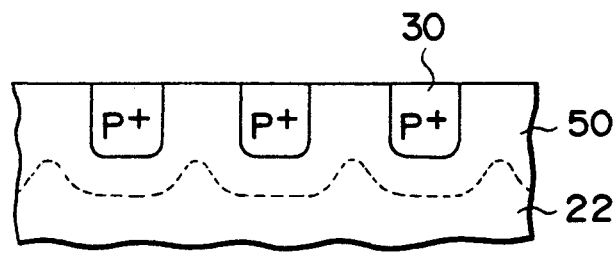
FIG. 6 is a sectional view showing a part of a Schottky diode device manufactured according to the invention.
Figure 7:
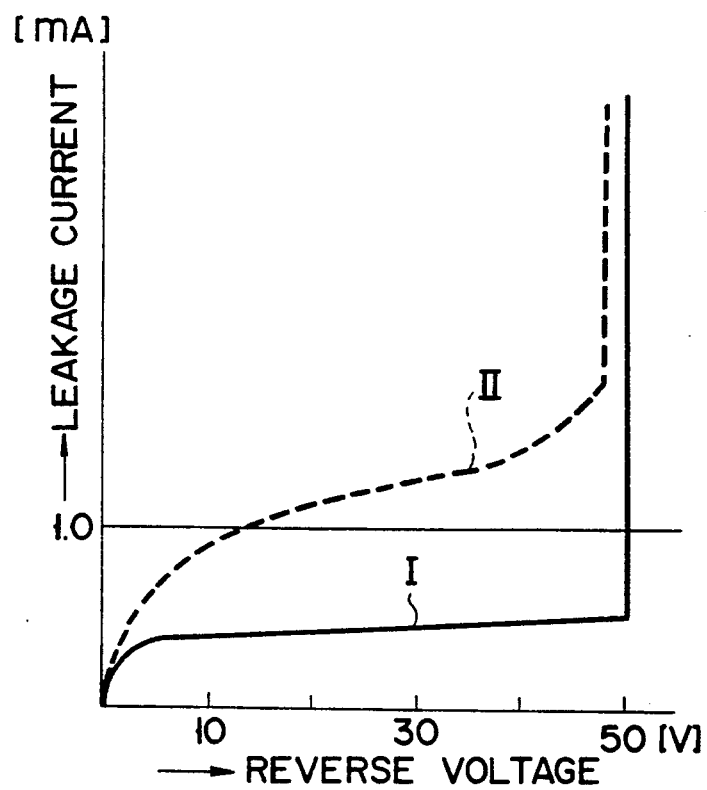
FIG. 7 is a graph showing leakage current characteristics of a Schottky diode device manufactured according to the invention.

When ion implantation or the like is performed using the thus patterned oxide layer 23 as a mask to form the p$^+$-type regions including individual region 30 in the epitaxial layer 22 the p$^+$-type regions 30 can have the size hardly deviating from the target size. Therefore, Schottky barrier diodes can be fabricated at high positional precisions by forming the barrier metal layer 31. As a result, when a reverse bias is applied to the p-n junction between the p$^+$-type regions 30 and n$^-$-type, epitaxial layer 22 (i.e., a negative voltage to the electrode 32, and a positive voltage to the back electrode), combined depletion layer 50 can be formed uniformly around the p$^+$-type regions 30, as shown in FIG. 6. In fact, when a reverse voltage of up to about 50 V was applied to the Schottky diode device of the invention, even if the diode device had a Ti layer as the barrier metal, a leakage current could be suppressed to 1 mA or less as indicated a curve I in FIG. 7. In contrast, when a reverse voltage of over 10 V was applied to a Schottky diode device manufactured using the conventional resist which is not divided into unit regions, a leakage current was found to be 1 mA or more as indicated by a curve II in FIG. 7.

The present invention has been described with reference to the specific embodiments wherein a unit region UR has a maximum width of about 350 μm, but it should not be limited thereto. The divided unit region UR can have a maximum width of about 500 μm. In this case, the positioning errors are 0.5 μm or less, and it is confirmed that the same effect as described above can be obtained. Further, in the embodiment described above, the individual openings of a diameter of 1 μm are made in the resist layer so as to be arranged in a square matrix at a pitch of 5.0 μm. However, the individual openings can be arranged at a pitch of 3 μm, 4 μm, 7 μm or 10 μm, and in a staggered manner such as triangle matrix. In these cases, the same effect as described above can be obtained. Further, the individual opening made in the resist can have a size of less than 1 μm.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as defined by the appended claims and their equivalents.

What is claimed is:

1. A Schottky diode device comprising:
   a semiconductor substrate of a first conductivity type;
   an annular insulating layer on the substrate and defining a device region therewithin;

a first annular isolation region of a second conductivity type opposite to the first conductivity type, in the device region along the annular insulating layer;

a second isolation region of the second conductivity type, dividing the device region into a plurality of unit regions each having a maximum width of not more than 500 μm, and spacing the unit regions apart from each other;

a plurality of semiconductor regions of the second conductivity type, multiple ones of the plurality of semiconductor regions being arranged in each unit region, said semiconductor regions being spaced apart from the second isolation and being spaced at a predetermined pitch apart from each other; and a barrier metal layer contacting the semiconductor regions to electrically connect them in parallel.

2. The device according to claim 1, further comprising an electrode metal layer on said barrier metal layer.

3. The device according to claim 1, wherein said barrier metal layer is divided into a plurality of subsections each contacting a plurality of said unit regions, and said electrode metal layer covers said subsections of said barrier metal layers.

4. The device according to claim 1, wherein each of the plurality of semiconductor regions has a planar size of no more than 1 μm.

5. A Schottky diode device comprising:

a semiconductor substrate of a first conductivity type;

an annular insulating layer on the substrate and defining a device region therewithin;

a first annular isolation region of a second conductivity type opposite to the first conductivity type, in the device region along the annular insulating layer;

a second isolation region, of the second conductivity type, defining a plurality of unit regions in the device region, each unit region having a width of not more than 500 μm, each unit region including a plurality of semiconductor regions of the second conductivity type, the semiconductor regions being spaced apart from the second isolation region and being spaced at a predetermined pitch apart from each other; and a barrier metal layer contacting the semiconductor regions to electrically connect them in parallel.

6. The device according to claim 5, further comprising an electrode metal layer on the barrier metal layer.

7. The device according to claim 5, wherein the barrier metal layer is divided into a plurality of subsections each contacting a plurality of the unit regions, and the electrode metal layer covers the subsections of the barrier metal layers.

8. The device according to claim 5, wherein each of the plurality of semiconductor regions has a planar size of no more than 1 μm.

9. A Schottky diode device comprising:

a semiconductor substrate of a first conductivity type;

an annular insulating layer on the substrate and defining a first region therewithin;

a first annular isolation region of a second conductivity type, in the first region along the annular insulating layer;

a second isolation region, of the second conductivity type, defining a plurality of subregions in the first region, each subregion including a plurality of semiconductor regions of the second conductivity type, the semiconductor regions being spaced apart from each other; and a barrier metal layer electrically connecting the plurality of semiconductor regions in parallel.

10. The device according to claim 9, further comprising an electrode metal layer on the barrier metal layer.

11. The device according to claim 9, wherein the barrier metal layer is divided into a plurality of subsections each contacting a plurality of the subregions, and the electrode metal layer covers the subsections of the barrier metal layers.

12. The device according to claim 9, wherein each of the subregions has a width of not more than 500 μm.

13. The device according to claim 9, wherein each of the subregions has a width of not more than 500 μm, and each of the plurality of semiconductor regions has a planar size of no more than 1 μm.

* * * * *